US011201178B2

(12) United States Patent
Chen et al.

(10) Patent No.: US 11,201,178 B2
(45) Date of Patent: Dec. 14, 2021

(54) ARRAY SUBSTRATE, MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Chuanbao Chen, Beijing (CN); Xiaobin Yin, Beijing (CN); Juncai Ma, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 713 days.

(21) Appl. No.: 16/072,325

(22) PCT Filed: Dec. 15, 2017

(86) PCT No.: PCT/CN2017/116569
§ 371 (c)(1),
(2) Date: Jul. 24, 2018

(87) PCT Pub. No.: WO2018/196403
PCT Pub. Date: Nov. 1, 2018

(65) Prior Publication Data
US 2021/0175260 A1  Jun. 10, 2021

(30) Foreign Application Priority Data
Apr. 25, 2017  (CN) .......................... 201710276838.7

(51) Int. Cl.
H01L 27/12 (2006.01)
G02F 1/136 (2006.01)
(Continued)

(52) U.S. Cl.
CPC ...... *H01L 27/1248* (2013.01); *G02F 1/13606* (2021.01); *G02F 1/136227* (2013.01);
(Continued)

(58) Field of Classification Search
CPC ............ H01L 27/1248; H01L 27/1288; H01L 27/124; G02F 1/13606; G02F 1/136236;
(Continued)

(56) References Cited

U.S. PATENT DOCUMENTS 6,067,134 A * 5/2000 Akiyama .............. G02F 1/1347
349/139
2002/0117691 A1* 8/2002 Choi ....................... H01L 27/12
257/225
(Continued)

FOREIGN PATENT DOCUMENTS

CN  101266950 A  9/2008
CN  101442060 A  5/2009
(Continued)

OTHER PUBLICATIONS

International Search Report and Written Opinion dated Feb. 28, 2018; PCT/CN2017/116569.

*Primary Examiner* — Igwe U Anya

(57) ABSTRACT

An array substrate, a manufacturing method thereof, and a display device are disclosed. The array substrate includes: a base substrate; a gate line located on the base substrate and extending in a first direction; a data line located on the base substrate and extending in a second direction; the gate line and the data line crossing each other to define an orthographic projection of a pixel region on the base substrate; an organic film located on the gate line and the data line and located in the pixel region; and a pixel electrode located on the organic film in the pixel region. The organic film located directly above the data line has a first thickness, the organic film located directly below the pixel electrode has a second
(Continued)

thickness, and the first thickness is greater than the second thickness.

20 Claims, 3 Drawing Sheets

(51) Int. Cl.
  *G02F 1/1362* (2006.01)
  *G02F 1/1343* (2006.01)
  *G02F 1/1368* (2006.01)
(52) U.S. Cl.
  CPC ...... *G02F 1/136236* (2021.01); *H01L 27/124* (2013.01); *H01L 27/1288* (2013.01); *G02F 1/1368* (2013.01); *G02F 1/134363* (2013.01); *G02F 2201/40* (2013.01)
(58) Field of Classification Search
  CPC ............ G02F 1/134363; G02F 1/1368; G02F 2201/40
  USPC .......................................................... 257/72
  See application file for complete search history.

(56) References Cited

U.S. PATENT DOCUMENTS

| | | | |
|---|---|---|---|
| 2005/0260780 A1* | 11/2005 | Ahn | H01L 27/124 438/30 |
| 2008/0227244 A1 | 9/2008 | Kim | |
| 2011/0090445 A1* | 4/2011 | Kim | G02F 1/1339 349/139 |
| 2015/0255327 A1 | 9/2015 | Park et al. | |
| 2016/0300860 A1 | 10/2016 | Park et al. | |
| 2017/0141132 A1 | 5/2017 | Yin et al. | |

FOREIGN PATENT DOCUMENTS

| | | |
|---|---|---|
| CN | 101893799 A | 11/2010 |
| CN | 102466933 A | 5/2012 |
| CN | 104867939 A | 8/2015 |
| CN | 106873278 A | 6/2017 |

* cited by examiner

US 11,201,178 B2

ARRAY SUBSTRATE, MANUFACTURING METHOD THEREOF, AND DISPLAY DEVICE

CROSS-REFERENCE TO RELATED APPLICATION

The present application claims priority of China Patent application No. 201710276838.7 filed on Apr. 25, 2017, the content of which is incorporated in its entirety as portion of the present application by reference herein.

TECHNICAL FIELD

At least one embodiment of the present disclosure relates to an array substrate, a manufacturing method thereof, and a display device.

BACKGROUND

With the development of the liquid crystal display industry, organic film technology has been widely applied in liquid crystal display panel products. The application of organic film technology can significantly reduce the parasitic capacitance between the common electrode and the data line, and the parasitic capacitance between the common electrode and the pixel electrode, thereby reducing power consumption.

SUMMARY

At least one embodiment of the present disclosure provides an array substrate, including: a base substrate; a gate line, located on the base substrate and extending in a first direction; a data line, located on the base substrate and extending in a second direction; the gate line and the data line crossing each other to define an orthographic projection of a pixel region on the base substrate; an organic film, located on the gate line and the data line, and located in the pixel region; and a pixel electrode, located on the organic film in the pixel region, wherein the organic film located directly above the data line has a first thickness, the organic film located directly below the pixel electrode has a second thickness, and the first thickness is greater than the second thickness.

In some embodiments of the present disclosure, the array substrate further includes: a thin film transistor, located in the pixel region, wherein the thin film transistor is located between the organic film and the base substrate, and the pixel electrode is connected to a drain electrode of the thin film transistor through a via hole in the organic film, a thickness of the organic film located directly above the thin film transistor is equal to the first thickness.

In some embodiments of the present disclosure, a thickness of the organic film located directly above the gate line is equal to the first thickness.

In some embodiments of the present disclosure, a ratio of the second thickness to the first thickness is not less than 0.5.

In some embodiments of the present disclosure, the pixel region further includes a common electrode, the common electrode is located on a side of the organic film away from the base substrate, and is overlapped with at least one of the data line and the gate line in a direction perpendicular to the base substrate.

In some embodiments of the present disclosure, the common electrode is located on a side of the pixel electrode away from the base substrate.

In some embodiments of the present disclosure, the common electrode is located between the pixel electrode and the organic film.

In some embodiments of the present disclosure, the common electrode is a transparent conductive electrode.

At least one embodiment of the present disclosure provides a manufacturing method of an array substrate, including: forming a gate line extending in a first direction and a data line extending in a second direction on a base substrate, wherein the gate line and the data line cross each other to define an orthographic projection of a pixel region on the base substrate; forming an organic film on the gate line and the data line, and in the pixel region; and forming a pixel electrode on the organic film, the pixel electrode being located in the pixel region, wherein the organic film located directly above the data line has a first thickness, the organic film located directly below the pixel electrode has a second thickness, and the first thickness is greater than the second thickness.

In some embodiments of the present disclosure, the manufacturing method of the array substrate further includes: forming a thin film transistor in the pixel region, wherein the thin film transistor is formed between the organic film and the base substrate, the pixel electrode is connected to a drain electrode of the thin film transistor through a via hole in the organic film, a thickness of the organic film located directly above the thin film transistor is equal to the first thickness.

In some embodiments of the present disclosure, the organic film is formed by using a half tone mask process.

In some embodiments of the present disclosure, the manufacturing method of the array substrate further includes: forming a common electrode in the pixel region, wherein the common electrode is formed on a side of the organic film away from the base substrate, and is overlapped with at least one of the data line and the gate line in a direction perpendicular to the base substrate.

In some embodiments of the present disclosure, the common electrode is formed on a side of the pixel electrode away from the base substrate or between the pixel electrode and the organic film.

At least one embodiment of the present disclosure provides a display device, including the array substrate provided by any one of the embodiments of the present disclosure.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIG. 1b is a cross-sectional view of the array substrate shown in FIG. 1a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

In the technology known by the inventor(s), it will bring some disadvantages to apply organic film technology in a liquid crystal display device. For example, because a disposed organic film has a relatively large thickness, a via hole of the organic film is relatively large, thereby affecting aperture ratio of pixel. In addition, because an organic film has a relatively large thickness, the via hole of the organic film is relatively deep, resulting in lapping defects of a pixel electrode in the via hole, thereby resulting in dark spots.

Figure 1A:
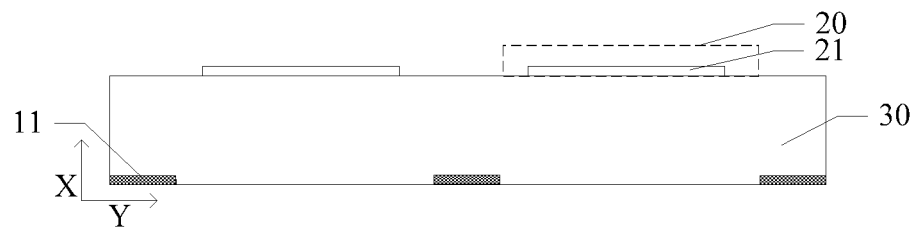
FIG. 1a is a cross-sectional view of an array substrate.

In the technique known by the inventor(s), FIG. 1a is a cross-sectional view of an array substrate. As illustrated by FIG. 1a, the array substrate includes data lines 11, a pixel region 20 defined by the data lines 11 and gate lines (not shown in FIG. 1a) which cross each other, an organic film 30 located on the data lines 11 and the gate lines, and located in the pixel region 20, and a pixel electrode 12 located on the organic film 30 in the pixel region 20. Generally, thickness of the organic film in the display region is uniform, that is, the thickness of the organic film 30 located directly above the data lines 11 is the same as the thickness of the organic film 30 located in the pixel region 20. It should be noted that a thickness of a data line is relatively small with respect to the thickness of the organic film, and the thickness of the data line may not be considered here. FIG. 1a schematically illustrates that the thickness of the organic film is uniform at different positions of the display region, and an upper surface of the organic film away from the data lines is illustrated as a plane, but in the actual process, the upper surface of the organic film away from the data lines is not completely planar, and the organic film located at the positions where the data lines are located has fluctuations. Similarly, the organic film located directly above the thin film transistor mentioned later is the organic film in the pixel region, and the upper surface of the organic film away from the thin film transistor is also illustrated as a plane.

Figure 1B:
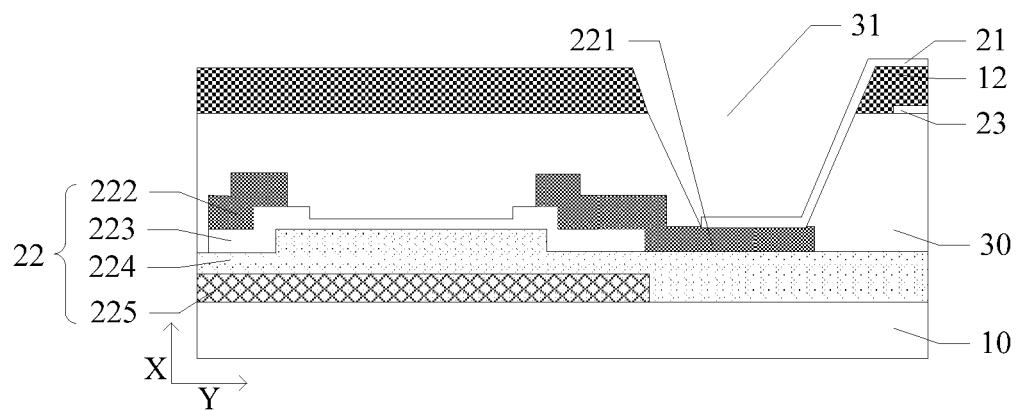

FIG. 1b is a cross-sectional view of the array substrate shown in FIG. 1a. As illustrated by FIGS. 1a and 1b, the array substrate further includes a base substrate 10. The pixel region 20 located on the base substrate 10 further includes a common electrode 23 and a thin film transistor 22. The thin film transistor 22 includes a drain electrode 221 electrically connected with the pixel electrode 21, a source electrode 222 electrically connected with the data line 11, a gate electrode 225 electrically connected with the gate line, an active layer 223, and a gate insulating layer 224. FIG. 1b is described by taking a case where the array substrate is an array substrate in advanced super-dimensional filed switching (ADS) technology. That is, the pixel electrode 21 is located on a side of the common electrode 23 away from the base substrate 10, and the pixel electrode 21 and the common electrode 23 are provided with a passivation layer 12 therebetween.

As illustrated by FIG. 1b, because the thickness of the organic film 30 is relatively large, that is, a size of the organic film 30 in the X direction shown in FIG. 1b is relatively large, a hole diameter of the via hole 31 of the organic film 30 is relatively large, thereby reducing the aperture ratio of pixel.

Figure 1C:
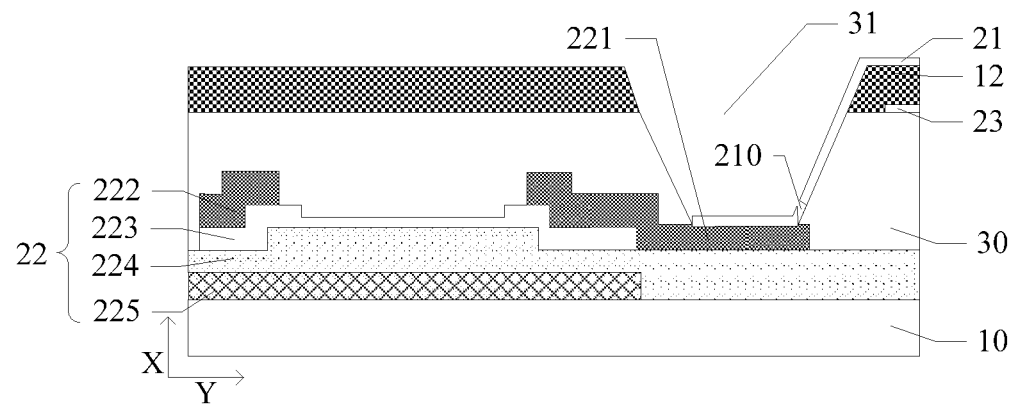
FIG. 1c is a schematic view of a breaking pixel electrode of the array substrate shown in FIG. 1b.

FIG. 1c is a schematic view of a breaking pixel electrode of the array substrate shown in FIG. 1b. As illustrated by FIG. 1c, because the thickness of the organic film 30 is relatively large, a depth of the via hole 31 in the X direction is relatively large, so that a portion of the pixel electrode 21 which is lapped with the drain electrode 221 in the via hole 31 breaks, thereby generating a crack 210. In this way, a dark spot appears in the display region, resulting in poor display.

The embodiments of the present disclosure provide an array substrate, a manufacturing method thereof, and a display device. The array substrate includes a base substrate; a gate line located on the base substrate and extending in a first direction; a data line located on the base substrate and extending in a second direction; the gate line and the data line crossing each other to define an orthographic projection of a pixel region on the base substrate; an organic film located on the gate line and the data line, and located in the pixel region; and a pixel electrode located on the organic film in the pixel region. The organic film located directly above the data line has a first thickness, the organic film located directly below the pixel electrode has a second thickness, and the first thickness is greater than the second thickness.

In the embodiments of the present disclosure, the pixel region refers to a spatial concept including a region on the base substrate defined by the gate line and the data line which cross each other and a space located directly above the region.

The array substrate of the embodiments of the present disclosure has at least a part of the following technical advantages: for example, the power consumption can be reduced; for example, the aperture ratio of pixel can be increased, and overlapping defects of the pixel electrode can be avoided; for example, the image display can be improved.

Hereafter, the array substrate, the manufacturing method of the array substrate, and the display device provided by the embodiments of the present disclosure will be described with reference to the accompanying drawings.

Figure 2A:
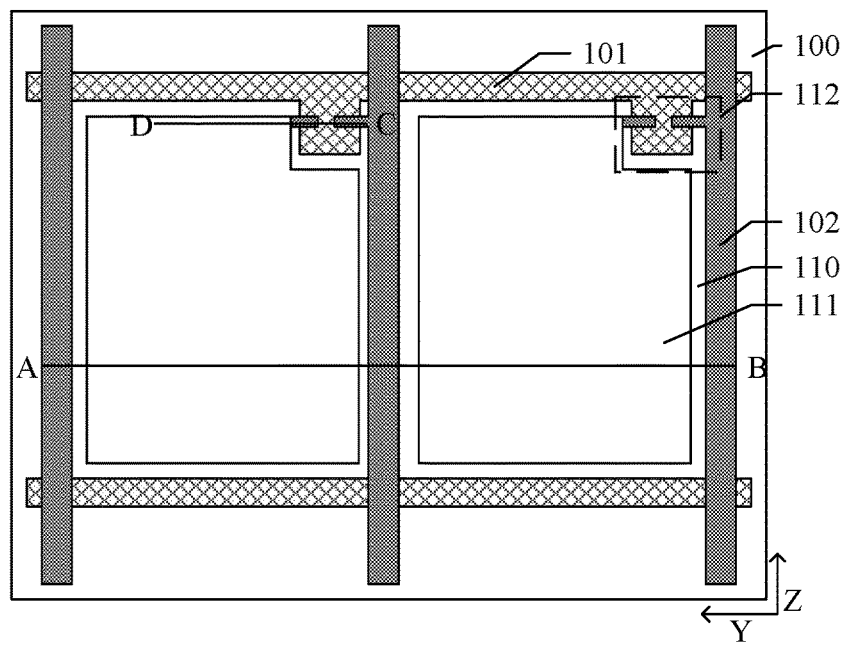
FIG. 2a is a planar view of an array substrate provided by an embodiment of the present disclosure.
Figure 2B:
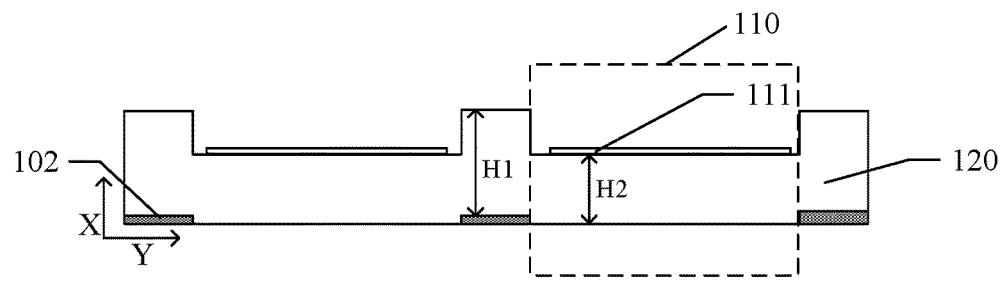
FIG. 2b is a cross-sectional view of the array substrate shown in FIG. 2a in an AB direction.

An embodiment of the present disclosure provides an array substrate. FIG. 2a is a planar view of an array substrate provided by an embodiment of the present disclosure. FIG. 2b is a cross-sectional view of the array substrate shown in FIG. 2a in an AB direction. As illustrated by FIG. 2a and FIG. 2b, the array substrate includes: a base substrate 100;

a gate line 101 located on the base substrate 100 and extending in a first direction; a data line 102 located on the base substrate 100 and extending in a second direction; the gate line 101 and the data line 102 crossing each other to define an orthographic projection of the pixel region 110 on the base substrate 100; an organic film 120 located on the gate line 101 and the data line 102, and located in the pixel region 110; and a pixel electrode 111 located on the organic film 120 in the pixel region 110.

The gate line 101 and the data line 102 cross each other to define an orthographic projection of the pixel region 110 on the base substrate 100, which refers to that the gate line 101 and the data line 102 cross each other to define the pixel region 110. In addition, the organic film 120 is located on the gate line 101 and the data line 102, and located in the pixel region 110, which refers to that, with regard to orthographic projections of the gate line 101, the data line 102, and the pixel region 110 on the base substrate 100, the organic film 120 is disposed away from the base substrate 100, and an orthographic projection of the organic film 120 on the base substrate 100 includes a portion covering the gate line 101 and the data line 102, and another portion located in the orthographic projection of the pixel region 110 on the base substrate 100.

Optionally, the "first direction" refers to the Y direction shown in FIG. 2a, and the "second direction" refers to the Z direction shown in FIG. 2a. The embodiments of the present disclosure are not limited thereto, for example, the first direction can also be the Z direction, and the second direction can be the Y direction.

Optionally, the first direction and the second direction are intersected, for example, the first direction and the second direction are perpendicular to each other, but the embodiments of the present disclosure are not limited thereto. For example, the first direction and the second direction may also form an acute angle, and the first direction and the second direction may also form an obtuse angle.

As illustrated by FIG. 2b, the organic film 120 located directly above the data line 102 (i.e., in the X direction) has a first thickness H1, the organic film 120 located directly below the pixel electrode 111 (i.e., in a direction parallel to X) has a second thickness H2, and the first thickness H1 is greater than the second thickness H2.

The array substrate provided by the embodiments of the present disclosure can increase the aperture ratio of pixel and avoid the lapping defects of the pixel electrode, so as to achieve the purpose of improving the image display.

It should be noted that the thickness of the data line is relatively small with respect to the thickness of the organic film, and the thickness of the data line may not be considered here. The thickness of the organic film 120 and the data line 102 in FIG. 2b is only schematic.

In some embodiments of the present disclosure, the orthographic projection of the pixel electrode on the base substrate is not overlapped with the orthographic projection of the data line (gate line) on the base substrate.

For example, the orthographic projection of the pixel electrode on the base substrate and the orthographic projection of the data line (gate line) on the base substrate are spaced apart in the Y(Z) direction; or in the X direction, an edge of the pixel electrode is aligned with an edge of the data line (gate line), and the embodiments of the present disclosure are not limited thereto.

For example, a material of the organic film 120 can include a material having good light transmittance such as one or a combination of ones selected from the group consisting of polyimide, polyamide, polycarbonate, epoxy resin, and the like. The embodiments of the present disclosure include, but are not limited thereto. For example, the material of the organic film 120 can also include a material having a good light transmittance such as a photoresist material. In the embodiments of the present disclosure, the organic film located on the gate line and the data line, and located in the pixel region can effectively avoid the crosstalk of signals between the pixel electrode and the data line (gate line), and reduce parasitic capacitance between the pixel electrode and the data line (gate line), so that the power consumption can be reduced.

For example, a material of the base substrate 100 includes one or a combination of ones selected from the group consisting of polyimide, polycarbonate, polyacrylate, polyetherimide, and polyether sulfone. The present embodiment includes but is not limited thereto.

For example, a material of the data line 102 can include one or a combination of ones selected from the group consisting of aluminum, platinum, silver, gold, nickel, chromium, and copper, and the present embodiment includes but is not limited thereto.

For example, a material of the gate line 101 can include a metal oxide material, for example, the material of the gate line 101 can include one or a combination of ones selected from the group consisting of indium tin oxide, indium zinc oxide, zinc oxide, indium oxide, and indium gallium oxide. The present embodiment is not limited thereto, for example, the material of the gate line 101 can also include one or a combination of ones selected from the group consisting of the molybdenum, titanium, aluminum, copper, and other metal materials.

For example, as illustrated by FIG. 2b, the organic film 120 located between adjacent pixel electrodes 111 can form a separation wall to prevent the influence of the electric field between adjacent pixel electrodes 111.

Figure 2C:
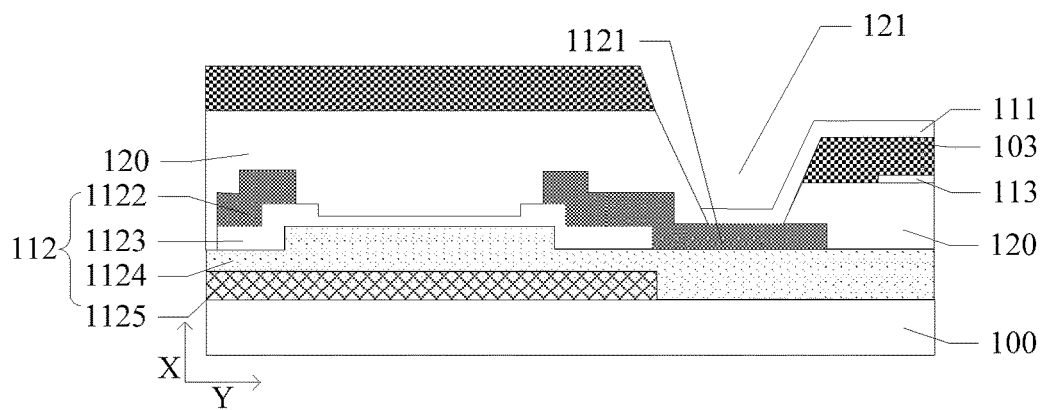
FIG. 2c is a cross-sectional view of the array substrate shown in FIG. 2a in a CD direction.

For example, FIG. 2c is a cross-sectional view of the array substrate shown in FIG. 2a in a CD direction. As illustrated by FIG. 2c, the array substrate further includes a thin film transistor 112 located in the pixel region 110. The thin film transistor 112 is located between the organic film 120 and the base substrate 100. The thin film transistor 112 includes a drain electrode 1121, and the pixel electrode 111 is connected to the drain electrode 1121 of the thin film transistor 112 through a via hole 121 in the organic film 120. The thin film transistor 112 further includes a source electrode 1122 electrically connected with the data line 102, a gate electrode 1125 electrically connected with the gate line 101, an active layer 1123, and a gate insulating layer 1124.

For example, as illustrated by FIG. 2c, a thickness of the organic film 120 located directly above (in the X direction) the thin film transistor 112 is equal to the first thickness H1, that is, the thickness of the organic film 120 located directly above the thin film transistor 112 is the same as the thickness of the organic film 120 located directly above the data line 102, and is greater than the thickness of the organic film 120 located directly below the pixel electrode 111. It should be noted that the thickness of the organic film located directly below the pixel electrode is the thickness of the organic film located directly below the pixel electrode which is located outside a via hole region.

In the pixel region of the array substrate provided in the present embodiment, only the organic film located directly below the pixel electrode has a relatively small thickness, so that hole diameter and depth of the via hole in the organic film can be reduced. Therefore, in a case where the pixel electrode is connected to the drain electrode of the thin film transistor through the via hole in the organic film, lapping defects of the pixel electrode can be avoided, i.e., cracking of the lapping portion of the pixel electrode in the via hole can be avoided. In addition, the aperture ratio of the pixel can be improved by reducing the hole diameter of the via hole.

It should be noted that the present embodiment is not limited thereto. For example, the thickness of the organic film located directly above the thin film transistor can also be different from the thickness of the organic film located directly above the data line.

For example, the thickness of the organic film located directly above the thin film transistor can be the same as the thickness of the organic film located directly below the pixel electrode.

For example, the thin film transistor can be provided with no organic film thereon, as long as the thickness of the organic film located directly below the pixel electrode is smaller than the thickness of the organic film located directly above the data line.

For example, the thickness of the organic film 120 located directly above the gate line 101 is equal to the first thickness H1, that is to say, the thickness of the organic film 120 located directly above the gate line 101 is the same as the thickness of the organic film 120 located directly above the data line 102. The present embodiment includes but is not limited thereto.

For example, a ratio of the second thickness H2 to the first thickness H1 is not less than 0.5. That is, with respect to the thickness of the organic film 120 located directly above the data line 102, the thickness of the organic film 120 located directly below the pixel electrode 111 is reduced by less than ½ of the first thickness H1.

For example, the thickness of the organic film 120 in the X direction can include 1.8 μm to 2.2 μm, and the present embodiment includes but is not limited thereto.

The thickness of the organic film is not uniform in the entire display region of the array substrate provided in the present embodiment, that is, only the thickness of the organic film located directly below the pixel electrode is relatively small, so that the aperture ratio of the pixel can be improved and the lapping defects of the pixel electrode can be avoided, so as to further achieve the purpose of improving the image display.

For example, as illustrated by FIG. 2c, the pixel region 110 is further provided with a common electrode 113. The common electrode 113 is located on a side of the organic film 120 away from the base substrate 100 and is overlapped with at least one of the data line 102 and the gate line 101 in a direction perpendicular to the base substrate 100, i.e., in the X direction.

For example, as illustrated by FIG. 2c, the common electrode 113 is located between the pixel electrode 111 and the organic film 120, and a passivation layer 103 is further provided between the pixel electrode 111 and the common electrode 113. The present example is described by taking a case where the array substrate is an array substrate in advanced super-dimensional field switching (ADS) technology as an example for description.

For example, the passivation layer 103 can include an inorganic material such as a metal oxide, a metal sulfide, or a metal nitride, and the present embodiment is not limited thereto.

For example, the metal oxide can include one or a combination of ones selected from the group consisting of calcium oxide, zinc oxide, copper oxide, titanium dioxide, and tin dioxide; the metal sulfide can include one or a combination of ones selected from the group consisting of iron sulfide, copper sulfide, zinc sulfide, and tin disulfide; the metal nitride may include silicon nitride and/or aluminum nitride, and the present embodiment includes but is not limited thereto.

Figure 2D:
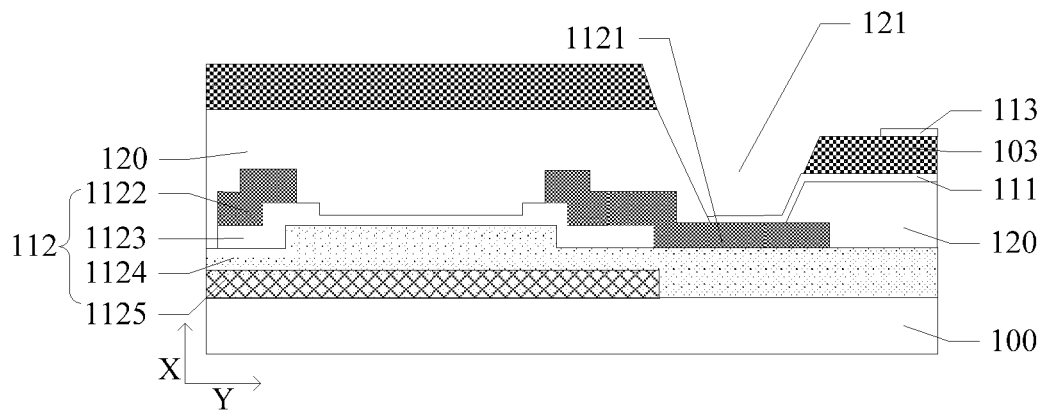
FIG. 2d is a cross-sectional view of the array substrate shown in FIG. 2a in the CD direction.

For example, FIG. 2d is a cross-sectional view of the array substrate shown in FIG. 2a in the CD direction. As illustrated by FIG. 2d, the common electrode 113 is located on the side of the pixel electrode 111 away from the base substrate 100, and a passivation layer 103 is further provided between the pixel electrode 111 and the common electrode 113. The present example is described by taking a case where the array substrate is an array substrate in high aperture ratio advanced super-dimensional field switching (HADS) technology as an example for description. The present embodiment is not limited to the array substrate in the ADS and HADS products, and the array substrate in the present embodiment can also be other array substrates using organic film technology.

For example, the common electrode 113 is a transparent conductive electrode.

For example, a material of the common electrode 113 can include a transparent conductive oxide.

For example, the material of the common electrode 113 can include one or a combination of ones selected from the group consisting of indium tin oxide, indium zinc oxide, zinc oxide, indium oxide, and indium gallium oxide, and the embodiments of the present disclosure are not limited thereto.

For example, the common electrode can also be a metal electrode.

In the present embodiment, in a direction perpendicular to the base substrate, the common electrode is overlapped with at least one of the data line and the gate line. Therefore, the organic film located on the gate line and the data line, and located in the pixel region can effectively avoid the crosstalk of the signals between the common electrode and the data line (gate line). And because the thickness of the organic film located directly above the data line (gate line) is relatively large, the parasitic capacitance between the common electrode and the data line (gate line) can be effectively reduced, thereby reducing the power consumption.

Figure 3:
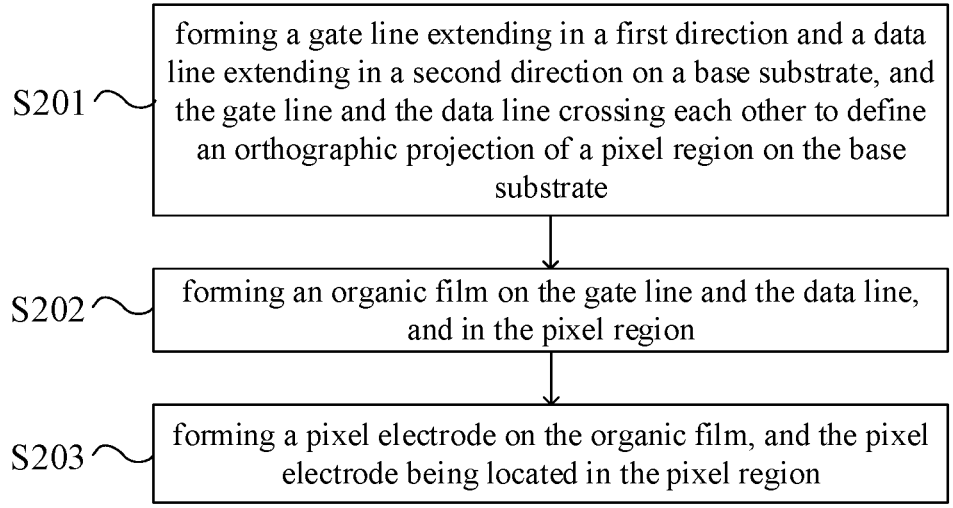
FIG. 3 is a schematic view of a manufacturing method of an array substrate provided by an embodiment of the present disclosure.

The present embodiment provides a manufacturing method of an array substrate. FIG. 3 is a schematic diagram of a manufacturing method of an array substrate provided by the present embodiment. As illustrated by FIG. 3, the specific steps include:

S201: forming a gate line extending in a first direction and a data line extending in a second direction on a base substrate, and the gate line and the data line crossing each other to define an orthographic projection of a pixel region on the base substrate.

For example, a gate electrode of a thin film transistor is formed in the pixel region on the base substrate, the gate electrode is electrically connected with the gate line. A gate insulating layer is deposited on the gate electrode by using a chemical vapor deposition method to cover the gate electrode, the gate line, and the like, and then the gate insulating layer is patterned to form a required pattern.

For example, a material of the gate insulating layer may include an oxide, a nitride, an oxynitride, or the like, and the present embodiment is not limited thereto.

For example, a semiconductor layer is formed on the gate insulating layer, and the semiconductor layer is patterned by using an active layer mask to form an active layer.

For example, the semiconductor layer is etched by using a dry etching method to form an active layer. The present embodiment includes but is not limited thereto.

For example, an interlayer insulating layer is formed on the active layer and the interlayer insulating layer is etched to form contact holes for electrical connection of a source electrode and the active layer, and a drain electrode and the active layer.

For example, the source electrode and the drain electrode is formed in the contact holes through a patterning process by using a source and drain electrode mask, and the formed source electrode is electrically connected with the data line.

For example, the source electrode and the drain electrode can be formed using any one or an alloy of a combination of ones selected from the group consisting of aluminum, copper, chromium, molybdenum, titanium, and other metal materials, the present embodiment is not limited thereto.

S202: forming an organic film on the gate line and the data line, and in the pixel region.

S203: forming a pixel electrode on the organic film, and the pixel electrode being located in the pixel region.

For example, an organic material film is formed on the gate line and the data line, and in the pixel region. The organic material film is patterned by using a half tone mask process, so that a thickness of the organic material film located directly above the data line is greater than a thickness of the organic material film in the pixel region (except the thin film), so as to form a required organic film.

For example, a material of the organic material film can include a material having relatively good light transmittance, such as one or a combination of ones selected from the group consisting of polyimide, polyamide, polycarbonate, epoxy resin, and the like. The present embodiment includes but is not limited thereto.

For example, the material of the organic material film may also be a material including a photoresist and the like.

For example, in a case where the organic material film adopts a material with relatively good light transmittance including a photoresist material, the organic material film is directly patterned by using a half tone mask process to form the organic film having different thicknesses, i.e., the thickness of the organic material film located directly above the data line is greater than the thickness of the organic material film located in the pixel region (except the thin film transistor). In an example, an organic material film is formed first, and then the organic material film is exposed by a half tone mask to form a completely exposed region at a position of a via hole, a partially exposed region in a region to be thinned (i.e., a region below the pixel electrode). The organic material film located directly above the data line and/or the gate line is not exposed. After that, the exposed organic material film is further developed to form the organic film having different thicknesses and the via hole therein. The present example is described by taking a case where the organic material film including a positive photoresist material as an example, but the present example is not limited thereto. For example, the organic material film can include a negative photoresist material.

For example, in a case where the material of the organic material film is a common light transmitting organic material, a photoresist layer can be formed on the organic material layer, and then the photoresist layer can be patterned by using a half tone mask process to form a photoresist layer having different thicknesses.

For example, the thickness of the photoresist layer located directly above the data line is greater than the thickness of the photoresist layer located in the pixel region (except the thin film transistor), and then the photoresist layer is subjected to an ashing treatment to thin the photoresist layer located directly above the data line, completely ash and remove the photoresist layer located in the pixel region (except the thin film transistor). The organic material layer in the pixel region (except the thin film transistor) which is not covered by the photoresist layer is etched to reduce the thickness of the organic material film, and then the photoresist layer located directly on the data line is stripped to form the required organic film.

For example, after the organic film is formed, a conductive layer is formed on the organic film which is located in the pixel region, and the conductive layer is patterned by using a pixel electrode mask to form a required pixel electrode.

For example, a material for forming the pixel electrode can include a transparent indium zinc metal oxide, etc., and the present embodiment is not limited thereto.

It should be noted that, the organic material film located in the pixel region (except the thin film transistor) is the organic material film located directly below the pixel electrode. In the present embodiment, the organic film formed directly above the data line has a first thickness, the organic film formed directly below the pixel electrode has a second thickness, and the first thickness is greater than the second thickness. Therefore, the array substrate manufactured by the manufacturing method of the array substrate provided by the present embodiment can improve the aperture ratio of the pixel and avoid the lapping defects of the pixel electrode, so as to achieve the purpose of improving the image display.

It should be noted that, the process for forming the organic film with different thicknesses is not limited in the present embodiment, as long as the thickness of the organic film formed directly above the data line is greater than the thickness of the organic film formed directly below the pixel electrode.

For example, in the present embodiment, the orthographic projection of the pixel electrode on the base substrate and the orthographic projection of the data line (gate line) on the base substrate are not overlapped with each other. Because the first thickness is greater than the second thickness, the organic film between adjacent pixel electrodes can form a separation wall to prevent the influence of the electric field between adjacent pixel electrodes.

For example, the thickness of the organic film formed directly above the thin film transistor is the same as the thickness of the organic film formed directly above the data line, that is, the thickness of the organic film formed directly above the thin film transistor is greater than the organic film formed directly below the pixel electrode.

For example, the pixel electrode is connected to the drain electrode of the thin film transistor through the via hole in the organic film. In the pixel region of the present embodiment, only the organic film formed directly below the pixel electrode has a small thickness, so that the hole diameter of the via hole in the organic film and the depth of the via hole in the direction perpendicular to the base substrate can be reduced. Therefore, in a case where the pixel electrode is connected to the drain electrode of the thin film transistor through the via hole in the organic film, the lapping defects of the pixel electrode can be avoided, that is, cracking of the lapping portion of the pixel electrode in the via hole can be avoided. In addition, the aperture ratio of the pixel can be improved by reducing the hole diameter of the via hole.

It should be noted that the present embodiment is not limited thereto, for example, the thickness of the organic film formed directly above the thin film transistor and the thickness of the organic film formed directly above the data line may not be the same.

For example, the organic film formed directly above the thin film transistor and the organic film formed directly below the pixel electrode can have the second thickness, i.e., the entire pixel region has the same thickness and the second thickness is smaller than the thickness of the organic film located directly above the data line.

For example, the thin film transistor can be provided with no organic film formed directly thereon.

For example, a thickness of the organic film located directly above the gate line is equal to the first thickness, i.e., the thickness of the organic film located directly above the gate line is the same as the thickness of the organic film located directly above the data line. The present embodiment includes but is not limited thereto.

For example, the thickness of the organic film in a direction perpendicular to the base substrate can include 1.8 μm to 2.2 μm, and the present embodiment includes but is not limited thereto.

For example, the organic film formed on the gate line and the data line, and in the pixel region in the present embodiment can effectively avoid the crosstalk of the signals between the pixel electrode and the data line (gate line), and reduce the parasitic capacitance between the pixel electrode and the data line (gate lines), which can reduce the power consumption.

The thickness of the organic film is not uniform in the entire display region of the array substrate provided by the present embodiment, that is, only the thickness of the organic film located directly below the pixel electrode is small, so that the aperture ratio of the pixel can be improved and the lapping defects of the pixel electrode can be avoided, so as to achieve the purpose of improving the image display.

For example, the pixel region further includes a common electrode formed on a side of the organic film away from the base substrate. In a direction perpendicular to the base substrate, the common electrode is overlapped with at least one of the data line and the gate line.

For example, in an example of the present embodiment, before forming the pixel electrode, a common electrode layer is formed on the organic film, and a common electrode mask is used to form a required common electrode pattern, and then a passivation layer is formed on the common electrode to cover the common electrode. The present example is described by taking a case where the array substrate is an array substrate of advanced super-dimensional field switching (ADS) technology as an example.

For example, a material of the passivation layer can include an inorganic material such as a metal oxide, a metal sulfide, or a metal nitride, and the present embodiment is not limited thereto.

For example, in another example of the present embodiment, a passivation layer is formed on the pixel electrode to cover the pixel electrode, then a common electrode layer is formed on the passivation layer, and a common electrode mask is used to form a required common electrode pattern. The present example is described by taking a case where the array substrate is an array substrate of high aperture ratio advanced super-dimensional field switching (HADS) technology as an example. The present embodiment is not limited to the array substrate in ADS and HADS products, and the array substrate in the present embodiment can also be other array substrates using organic film technology.

For example, the common electrode is a transparent conductive electrode.

For example, the material of the common electrode can include a transparent conductive oxide, and the embodiments of the present disclosure are not limited thereto.

For example, the common electrode can also be a metal electrode.

In the present embodiment, in the direction perpendicular to the base substrate, the common electrode is overlapped with at least one of the data line and the gate line. Therefore, the organic film formed on the gate line and the data line, and in the pixel region can effectively avoid the crosstalk of the signals between the common electrode and the data line (gate line). In addition, the thickness of the organic film located directly above the data line (gate line) is relatively large, which can effectively reduce the parasitic capacitance between the common electrode and the data line (gate line), thereby reducing the power consumption.

An embodiment of the present disclosure provides a display device including the array substrate provided by any of the above embodiments. By using the display device, the power consumption can be reduced, the aperture ratio of the pixel can be improved, and the lapping defects of the pixel electrode can be avoided, thereby improving the image display.

For example, the display device can be a liquid crystal display device, a television, a digital camera, a mobile phone, a watch, a tablet computer, a notebook computer, a navigator, and any product or component having a display function. The present embodiment is not limited thereto.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "above" or "below" another component or element, it may be directly above or below the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An array substrate, comprising:
a base substrate;
a gate line, located on the base substrate and extending in a first direction;
a data line, located on the base substrate and extending in a second direction;
the gate line and the data line crossing each other to define an orthographic projection of a pixel region on the base substrate;
an organic film, located on the gate line and the data line, and located in the pixel region; and
a pixel electrode, located on the organic film in the pixel region,
wherein the organic film located directly above the data line has a first thickness, the organic film located directly below the pixel electrode has a second thickness, the first thickness is greater than the second thickness, and the organic film located directly above the data line and the organic film located directly below the pixel electrode are integrated films.

2. The array substrate according to claim 1, further comprising:
a thin film transistor, located in the pixel region, wherein the thin film transistor is located between the organic film and the base substrate, and the pixel electrode is connected to a drain electrode of the thin film transistor through a via hole in the organic film, a thickness of the organic film located directly above the thin film transistor is equal to the first thickness.

3. The array substrate according to claim 2, wherein a thickness of the organic film located directly above the gate line is equal to the first thickness.

4. The array substrate according to claim 2, wherein a ratio of the second thickness to the first thickness is not less than 0.5.

5. The array substrate according to claim 1, wherein a thickness of the organic film located directly above the gate line is equal to the first thickness.

6. The array substrate according to claim 5, wherein a ratio of the second thickness to the first thickness is not less than 0.5.

7. The array substrate according to claim 1, wherein a ratio of the second thickness to the first thickness is not less than 0.5.

8. The array substrate according to claim 1, wherein the pixel region further comprises a common electrode, the common electrode is located on a side of the organic film away from the base substrate, and is overlapped with at least one of the data line and the gate line in a direction perpendicular to the base substrate.

9. The array substrate according to claim 8, wherein the common electrode is located on a side of the pixel electrode away from the base substrate or between the pixel electrode and the organic film.

10. The array substrate according to claim 8, wherein the common electrode is a transparent conductive electrode.

11. A display device, comprising the array substrate according to claim 1.

12. The array substrate according to claim 1, further comprising:
a passivation layer, located on a side of the organic film away from the base substrate, at least part of the passivation layer being in contact with the organic film,
wherein a distance between the base substrate and a part of the passivation layer located directly above the data line is greater than a distance between the base substrate and a part of the passivation layer located directly below the pixel electrode.

13. A manufacturing method of an array substrate, comprising:
forming a gate line extending in a first direction and a data line extending in a second direction on a base substrate, wherein the gate line and the data line cross each other to define an orthographic projection of a pixel region on the base substrate;
forming an organic film on the gate line and the data line, and in the pixel region; and
forming a pixel electrode on the organic film, the pixel electrode being located in the pixel region,
wherein the organic film located directly above the data line has a first thickness, the organic film located directly below the pixel electrode has a second thickness, the first thickness is greater than the second thickness, and
the organic film located directly above the data line and the organic film located directly below the pixel electrode are formed by a one-step patterning process.

14. The manufacturing method of the array substrate according to claim 13, further comprising:
forming a thin film transistor in the pixel region, wherein the thin film transistor is formed between the organic film and the base substrate, the pixel electrode is connected to a drain electrode of the thin film transistor through a via hole in the organic film, a thickness of the organic film located directly above the thin film transistor is equal to the first thickness.

15. The manufacturing method of the array substrate according to claim 13, wherein the organic film is formed by using a half tone mask process.

16. The manufacturing method of the array substrate according to claim 13, further comprising:
forming a common electrode in the pixel region, wherein the common electrode is formed on a side of the organic film away from the base substrate, and is overlapped with at least one of the data line and the gate line in a direction perpendicular to the base substrate.

17. The manufacturing method of the array substrate according to claim 16, wherein the common electrode is formed on a side of the pixel electrode away from the base substrate or between the pixel electrode and the organic film.

18. An array substrate, comprising:
a base substrate;
a gate line, located on the base substrate and extending in a first direction;
a data line, located on the base substrate and extending in a second direction;
the gate line and the data line crossing each other to define an orthographic projection of a pixel region on the base substrate;
an organic film, located on the gate line and the data line, and located in the pixel region; and
a pixel electrode, located on the organic film in the pixel region,
wherein the organic film located directly above the data line has a first thickness, the organic film located directly below the pixel electrode has a second thickness, the first thickness is greater than the second thickness, and a ratio of the second thickness to the first thickness is not less than 0.5.

19. The array substrate according to claim 18, further comprising:
a thin film transistor, located in the pixel region, wherein the thin film transistor is located between the organic film and the base substrate, and the pixel electrode is connected to a drain electrode of the thin film transistor through a via hole in the organic film, a thickness of the organic film located directly above the thin film transistor is equal to the first thickness.

20. The array substrate according to claim 18, wherein a thickness of the organic film located directly above the gate line is equal to the first thickness.

* * * * *